(12) United States Patent
Yanagisawa

(10) Patent No.: US 7,851,240 B2
(45) Date of Patent: Dec. 14, 2010

(54) METHOD OF FORMING DIFFRACTION GRATING AND METHOD OF FABRICATING DISTRIBUTED FEEDBACK LASER DIODE

(75) Inventor: Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/547,899

(22) Filed: Aug. 26, 2009

(65) Prior Publication Data

US 2010/0081224 A1 Apr. 1, 2010

(30) Foreign Application Priority Data

Sep. 26, 2008 (JP) ............................. 2008-248797

(51) Int. Cl.
*H01L 21/00* (2006.01)

(52) U.S. Cl. .................. 438/29; 438/27; 257/E21.502; 257/E33.023

(58) Field of Classification Search .................. 438/27, 438/29; 257/E21.502, E33.023
See application file for complete search history.

(56) References Cited

U.S. PATENT DOCUMENTS 7,709,282 B2 * 5/2010 Fukshima et al. ............. 438/26

2006/0151435 A1 * 7/2006 Taniguchi .................... 216/87

OTHER PUBLICATIONS

Stephen Y. Chou et al., "Nanoimprint lithography", The Journal of Vacuum Science and Technology B, 14(6), Nov./Dec. 1996, pp. 4129-4133.

* cited by examiner

*Primary Examiner*—Alexander G Ghyka
*Assistant Examiner*—Seahvosh J Nikmanesh
(74) *Attorney, Agent, or Firm*—Smith, Gambrell & Russell, LLP

(57) ABSTRACT

A method of forming a diffraction grating according to the present invention includes a step of preparing a mold having projections and recesses for forming a diffraction grating, a step of bringing the projections and recesses of the mold into contact with a resin layer in a chamber at a first pressure less than atmospheric pressure, a step of setting a pressure in the chamber to a second pressure more than the first pressure while maintaining the contact, and a step of hardening the resin layer while maintaining the contact between the resin layer and the projections and recesses so as to form a pattern for the diffraction grating on the hardened resin layer. The recesses in the projections and recesses of the mold form a closed pattern in the plane of the mold including the projections and recesses.

12 Claims, 5 Drawing Sheets

METHOD OF FORMING DIFFRACTION GRATING AND METHOD OF FABRICATING DISTRIBUTED FEEDBACK LASER DIODE

BACKGROUND OF THE INVENTION

1. Field of the Invention

The present invention relates to a method of forming a diffraction grating and a method of fabricating a distributed feedback laser diode.

2. Description of the Related Art

To date, a nano-imprint technique has been known in which a mold having a predetermined pattern is pressed against a resin layer so that the pattern is transferred to the resin layer, and using the resin layer as a mask, the pattern is formed on a semiconductor surface. Non-Patent Reference 1 (Stephen Y. Chou et al., "Nanoimprint lithography", The Journal of Vacuum Science and Technology B, 14(6), November/December 1996, pp. 4129-4133) describes a method of forming a pattern for a diffraction grating, using a nano-imprint technique.

SUMMARY OF THE INVENTION

When a mold is pressed against a resin layer in a nano-imprint technique, if the ratio of the width to depth (i.e., aspect ratio) of recesses in the pattern of the mold is relatively large, it is necessary to press the mold under a high pressure in order to fully fill the recesses of the mold with portions of the resin layer. However, in the case where the mold is strongly pressed against the resin layer, it has been known that problems, such as acceleration of degradation of the mold, need for a high-pressure apparatus for applying a high pressure, and damage to the substrate, may occur. Furthermore, in the case where there is a deviation in the density of the pattern formed on the mold, it has been known that the extent of entry of portions of the resin layer into the recesses varies, which may cause defects in the pattern of the diffraction grating.

It is an object of the present invention to provide a method of forming a diffraction grating and a method of fabricating a distributed feedback laser diode in which, in the process of forming a diffraction grating using a nano-imprint technique, a good pattern with a small number of diffraction grating pattern defects can be obtained, and no damage is caused to the substrate.

A method of forming a diffraction grating according to the present invention includes a step of preparing a mold having projections and recesses for forming a diffraction grating, a step of bringing the projections and recesses of the mold into contact with a resin layer in a chamber at a first pressure less than atmospheric pressure, a step of setting a pressure in the chamber to a second pressure more than the first pressure while maintaining the contact, and a step of hardening the resin layer while maintaining the contact between the resin layer and the projections and recesses so as to form a pattern for the diffraction grating on the hardened resin layer. The recesses in the projections and recesses of the mold form a closed pattern in the plane of the mold including the projections and recesses.

In the method of forming the diffraction grating described above, the projections and recesses of the mold are brought into contact with the resin layer in a chamber at a first pressure less than atmospheric pressure. In this step, the recesses in the projections and recesses of the mold form a closed pattern in the plane of the mold including the projections and recesses, and thereby, the space delimited by the recesses and the resin layer is kept in an airtight state. In the next step, the pressure in the chamber is set to a second pressure more than the first pressure in such a state by introducing a gas into the chamber. A portion of the resin layer not facing the projections and recesses is pressed by a differential pressure between the first pressure and the second pressure, and portions of the resin layer having an airtight space between themselves and the recesses are sucked into the recesses. By such an action, even if the mold is not strongly pressed against the resin layer, the recesses of the mold are fully filled with portions of the resin layer. Consequently, by hardening the resin layer while maintaining such a contact between the resin layer and the mold, the pattern for the diffraction grating is accurately transferred and molded into the resin layer, and it is possible to decrease the number of defects of the pattern of the diffraction grating formed using, as a mask, the resin layer having the pattern for the diffraction grating.

In the method of forming the diffraction grating, the resin layer may be composed of a thermoplastic resin or a thermosetting resin. Preferably, the resin layer may be composed of an ultraviolet (UV) curing resin. The UV curing resin has a low viscosity compared with other resins, such as a thermoplastic resin. Therefore, when the resin layer is composed of the UV curing resin, portions of the resin layer having an airtight space between themselves and the recesses of the mold easily move into the recesses. Consequently, the pattern for the diffraction grating can be more accurately transferred and molded into the resin layer, and thus the number of diffraction grating pattern defects can be further decreased.

Furthermore, in the method of forming the diffraction grating, the mold may be composed of a material that is transparent to ultraviolet light, and the resin layer may be hardened by irradiating the resin layer with ultraviolet light through the mold. As the material that is transparent to ultraviolet light, silica may be used.

Furthermore, in the method of forming the diffraction grating, the viscosity of the resin layer before being hardened may be 1.0 mPa·sec or less. By using the resin layer having such a low viscosity, portions of the resin layer having an airtight space between themselves and the recesses of the mold become easily to move into the recesses. Consequently, the pattern for the diffraction grating can be more accurately transferred and molded into the resin layer, thus further decreasing the number of diffraction grating pattern defects.

Furthermore, in the method of forming the diffraction grating, the second pressure in the chamber is an atmospheric pressure. In such a case, the portion of the resin layer not facing the projections and recesses can be more easily and effectively pressed by the atmospheric pressure, and the recesses of the mold can be suitably filled with portions of the resin layer.

Furthermore, in the method of forming the diffraction grating, the projections and recesses of the mold may include a plurality of first projections which are arranged in rows in a direction intersecting with a predetermined direction, the predetermined direction being a longitudinal direction, and a second projection which surrounds the plurality of first projections. In such a case, in the projections and recesses for forming the diffraction grating, a closed pattern in which the recesses are closed in the plane of the mold can be suitably formed. More preferably, the second projection disposed so as to surround the plurality of first projections may have a rectangular frame shape having portions extending in the predetermined direction and portions extending in the direction intersecting with the predetermined direction. More preferably, in the projections and recesses formed in the mold, a first recess is disposed in a space between two adjacent first projections, and a second recess is disposed between the first projections and the second projection so that the recesses form a closed pattern in the plane of the mold, in which the second recess and the first recess are integrated to form the closed pattern in the plane of the mold including the projections and recesses.

Furthermore, a method of fabricating a distributed feedback laser diode according to the present invention includes a step of forming a resin layer on a semiconductor substrate including an active layer, a step of preparing a mold having projections and recesses for forming a diffraction grating, a step of bringing the projections and recesses of the mold into contact with the resin layer in a chamber at a first pressure less than atmospheric pressure, a step of setting a pressure in the chamber to a second pressure more than the first pressure while maintaining the contact, a step of hardening the resin layer while maintaining the contact between the resin layer and the projections and recesses so as to form a pattern for the diffraction grating on the hardened resin layer, and a step of forming the diffraction grating by etching the semiconductor substrate using the pattern for the diffraction grating. The recesses in the projections and recesses of the mold form a closed pattern in the plane of the mold including the projections and recesses. According to such a method of fabricating a distributed feedback laser diode, by the same action as in the method of forming the diffraction grating described above, a pattern for the diffraction grating can be accurately transferred and molded into the resin layer, and it is possible to decrease the number of defects of the pattern of the diffraction grating formed using, as a mask, the resin layer having the pattern for the diffraction grating.

Furthermore, in the method of forming the diffraction grating and the method of fabricating the distributed feedback laser diode described above, the expression "the recesses form a closed pattern in the plane of the mold" means a state in which the outer edges of the recesses are completely surrounded by the side faces of the projections, etc. (in other words, the recesses are not open in the in-plane direction of the mold), and refers to a pattern in which an airtight space is formed by the recesses and the resin layer when the projections and recesses of the mold are brought into contact with the resin layer.

The object and other objects, features, and advantages of the present invention will become more apparent from the detailed description given hereinafter with reference to the accompanying drawings which are examples.

DESCRIPTION OF THE PREFERRED EMBODIMENTS

Figure 1A:
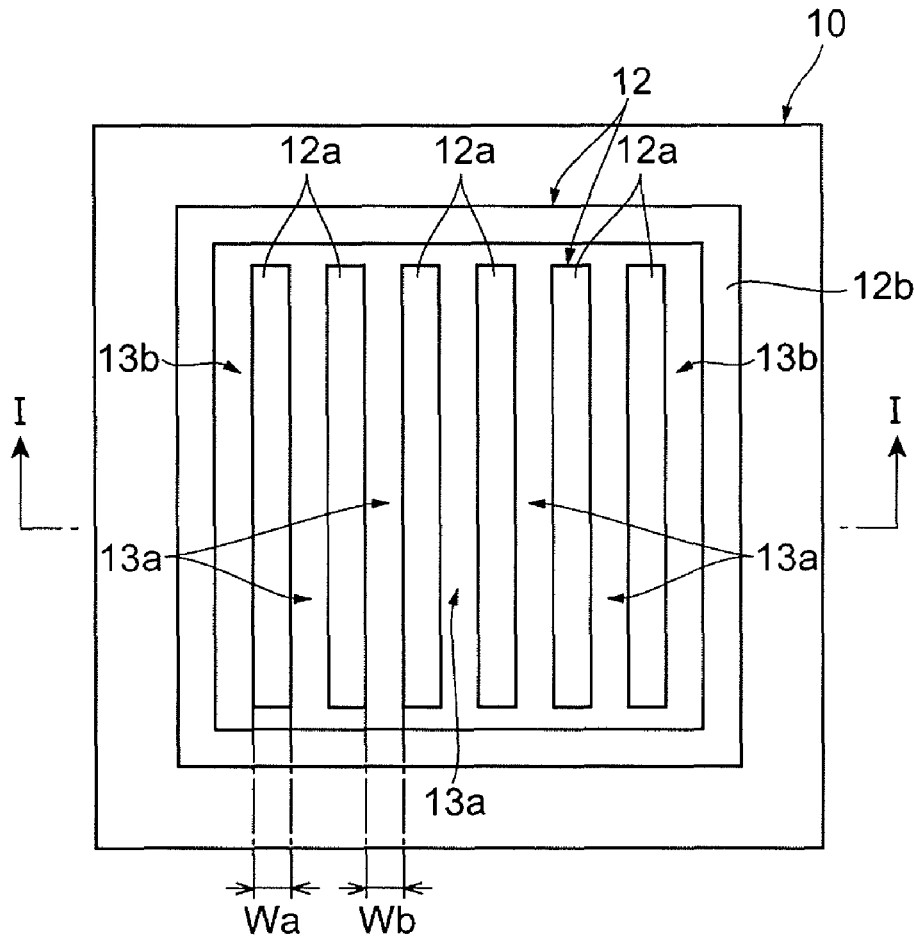
FIG. 1A is a schematic bottom view of a mold used in a method of forming a diffraction grating according to an embodiment of the present invention.

The embodiments of a method of forming a diffraction grating and a method of fabricating a distributed feedback laser diode according to the present invention will be described in detail below with reference to the accompanying drawings. In the drawings, the same components are designated by the same reference numerals, and duplicate descriptions are omitted.

<Method of Forming Diffraction Grating>

Figure 1B:
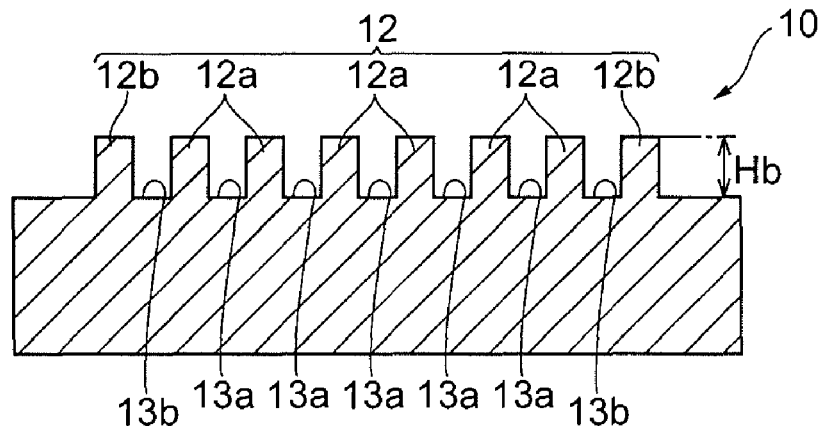
FIG. 1B is a schematic cross-sectional side view of the mold taken along the line I-I of FIG. 1A.

FIGS. 1A, 1B, and 2A to 2D are schematic views showing steps in a method of forming a diffraction grating according to an embodiment of the present invention. FIG. 1A is a bottom view of a mold 10 used in a method of forming a diffraction grating according to the embodiment, and FIG. 1B is a cross-sectional side view of the mold 10 taken along the line I-I of FIG. 1A. FIGS. 2A to 2D are cross-sectional side views showing steps of forming a pattern for a diffraction grating by a nano-imprint technique using the mold 10.

(Preparation of Mold)

First, a mold 10 is prepared as shown in FIGS. 1A and 1B. The mold 10 has, for example, a plate-like shape, and may be composed of various materials. For example, the mold 10 may have a structure in which a spin-on-glass (SOG) film having a predetermined pattern is bonded onto a silica substrate, or a structure in which a predetermined pattern is formed by etching on a surface of a silica substrate.

The mold 10 has projections and recesses 12 for forming a diffraction grating. The projections and recesses 12 are formed, for example, so as to include a plurality of projections 12a (first projections) and a projection 12b (second projection) disposed so as to surround the plurality of projections 12a, as shown in FIG. 1B. The plurality of projections 12a are disposed so as to be in parallel with each other with a predetermined direction being a longitudinal direction, and are arranged in rows in a direction intersecting with (in this embodiment, orthogonal to) the predetermined direction. A recess 13a is constituted by a space between two adjacent projections 12a. The width of each of the plurality of projections 12a and recesses 13a is determined on the basis of the width and the space required for the diffraction grating fabricated using the mold 10. In one example, the width Wa of the plurality of projections 12a is 120 nm, the width Wb of the recesses 13a is 120 nm, and the aspect ratio (Hb/Wb, wherein Hb represents the depth of the recesses 13a) of the recesses 13a is, for example, 3.

Furthermore, the projection 12b surrounds a plurality of projections 12a and has a rectangular frame shape having portions extending in the longitudinal direction of the plurality of projections 12a and portions extending in the direction in which the plurality of projections 12a are arranged. The projection 12b forms a recess 13b between the projection 12b and the plurality of projections 12a, and the recess 13b and the recesses 13a are integrated to form a closed pattern in the plane of the mold 10 including the projections and recesses 12. That is, the outer edges of the recess 13b are completely surrounded by the side faces of the projection 12b, and the recess 13b is not open in the in-plane direction of the mold 10.

(Imprinting of Mold)

Figure 2A:
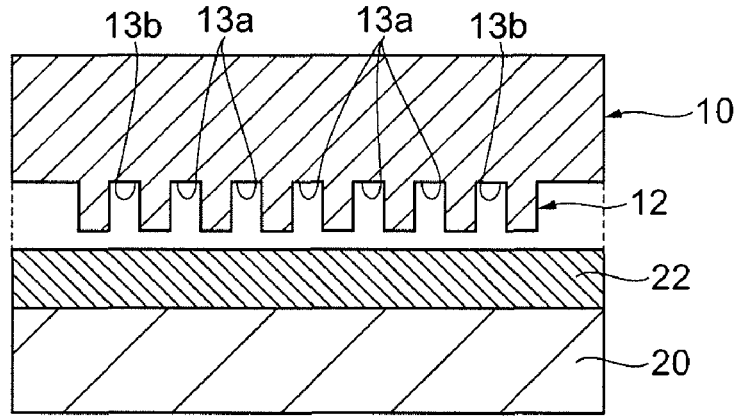
FIGS. 2A to 2D are cross-sectional side views showing steps of forming a pattern for a diffraction grating by a nano-imprint technique using a mold.
Figure 2B:
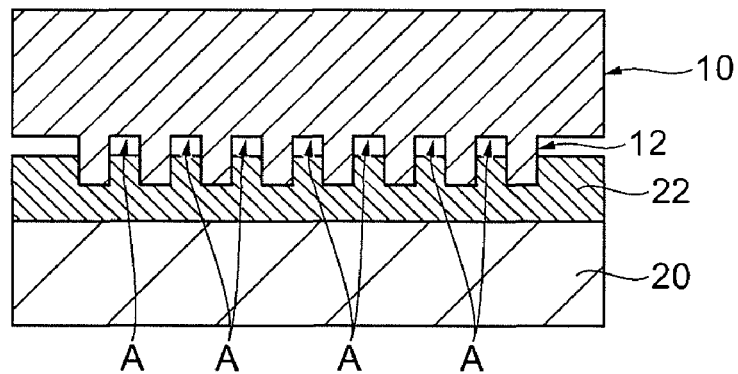

Next, as shown in FIGS. 2A and 2B, a surface of the mold 10 having the projections and recesses 12 is brought into contact with a resin layer 22 disposed on a substrate 20. The substrate 20 is, for example, a semiconductor substrate. The substrate may be a semiconductor wafer which is composed of semiconductor layers stacked on a semiconductor substrate. In this step, while maintaining the contact between the resin layer 22 and the projections and recesses 12 of the mold 10, the mold 10 and the substrate 20 are placed in a chamber, and then air and other gases in the chamber are evacuated by a vacuum pump to be a first pressure less than atmospheric pressure. For example, the first pressure is less than 1 Pa. Here, a surface of the mold 10 opposite to the resin layer 22 side surface (on which the projections and recesses 12 are formed) may be pressed by an external force. In such a case, preferably, the distance between the mold 10 and the substrate 20 is controlled to such an extent that the mold 10 and the substrate 20 are not in contact with each other directly. The resin layer 22 remains in existence between the mold 10 and the substrate 20.

In this stage, the recesses 13a and 13b included in the projections and recesses 12 of the mold 10 form a closed pattern in the plane of the mold 10 including the projections and recesses 12. Thereby, the space A constituted by the recesses 13a and 13b and the resin layer 22 is in an airtight state.

An ultraviolet (UV) curing resin, a thermoplastic resin, or the like can be used for the resin layer 22. The case where a UV curing resin or the like is used for the resin layer 22 is particularly referred to as an optical nano-imprinting method. Meanwhile, the case where a thermoplastic resin or the like is used for the resin layer 22 is referred to as a thermal nano-imprinting method. In this embodiment, in particular, preferably, a UV curing resin is used for the resin layer 22. The reason for this is that the resin layer 22 preferably has a relatively low viscosity (for example, 1.0 mPa·sec or less), and the UV curing resin satisfies such a low viscosity property. Furthermore, in the case where the resin layer 22 has, for example, a viscosity substantially the same as that of water (≈0.9 mPa·sec), the pressing pressure required for pressing the projections and recesses 12 against the resin layer 22 is 0.1 MPa or less. Furthermore, in the case where the resin layer 22 is composed of a thermoplastic resin, the resin layer is softened to a low viscosity state by increasing the temperature to a glass transition temperature or higher, and then the mold is pressed against the resin layer.

Figure 2C:
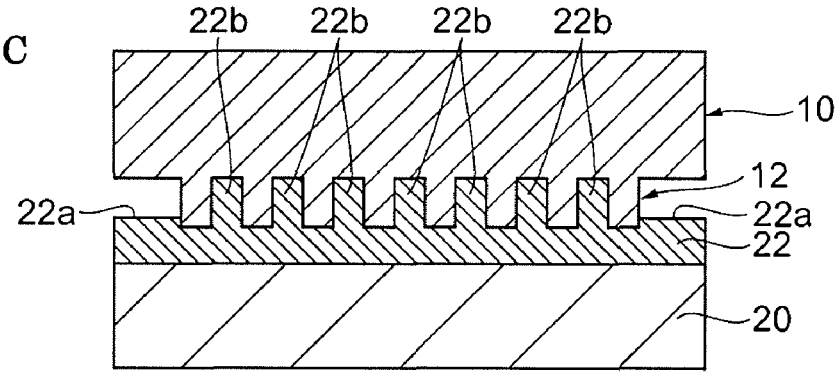

Next, while maintaining the contact between the resin layer 22 and the projections and recesses 12 of the mold 10, the pressure in the chamber is set to a second pressure more than the first pressure by introducing the gas such as air or nitrogen gas into the chamber. For example, the second pressure may be an atmospheric pressure. As a result, as shown in FIG. 2C, a portion 22a of the resin layer 22 not facing the projections and recesses 12 is pressed by the differential pressure between the first pressure and the second pressure, and portions 22b of the resin layer 22 having an airtight space A between themselves and the recesses 13a and 13b are sucked into the recesses 13a and 13b. Thus, the recesses 13a and 13b of the mold 10 are filled with the portions of the resin layer 22, and the shape of the projections and recesses 12 of the mold 10 is transferred to the resin layer 22.

(Hardening)

Next, the resin layer 22 is hardened while maintaining the contact between the resin layer 22 and the projections and recesses 12. Thereby, a pattern for the diffraction grating is formed on the hardened resin layer 22. In the case where the resin layer 22 is composed of a UV curing resin, the resin layer 22 can be hardened by irradiation of ultraviolet light. Meanwhile, in the case where the resin layer 22 is composed of a thermoplastic resin, hardening is performed by increasing the temperature from the softening temperature to the hardening temperature.

In the optical nano-imprinting method, in the case where ultraviolet light is applied from the mold 10 side to the resin layer 22, the mold 10 is preferably transparent to ultraviolet light. In the case where ultraviolet light is applied from the substrate 20 side to the resin layer 22, the substrate 20 is preferably transparent to ultraviolet light. Examples of such a material for the substrate 20 include silica.

In the thermal nano-imprinting method, preferably, the resin layer 22 is composed of a thermoplastic resin, such as polymethylmethacrylate (PMMA), a thermosetting resin layer, such as polyurethane (PUR), or the like.

(Detachment of Mold)

Figure 2D:
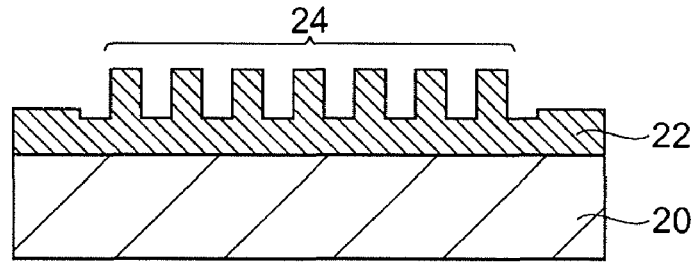

Next, as shown in FIG. 2D, the mold 10 is detached from the hardened resin layer 22. By undergoing the processes described above, it is possible to form a pattern 24 for the diffraction grating, the pattern 24 including a plurality of projections and recesses periodically arranged. The shape of the pattern 24 corresponds to the shape of the projections and recesses 12 of the mold 10. Furthermore, it may be possible to etch the entire surface of the hardened resin layer 22 using a dry etching process. In such a case, the substrate 20 may be exposed at the bottom of the recesses of the pattern 24. By further etching the exposed portions of the substrate 20 using, for example, a plasma etching technique or a wet etching technique, the diffraction grating pattern may be transferred to the substrate 20.

The method in which the diffraction grating is transferred to the substrate is suitable as a method of fabricating a DFB laser diode. That is, the diffraction grating is formed by transfer on the substrate, and epitaxial layers such as an active layer and a contact layer can be continuously grown on the diffraction grating without interruption of the epitaxial growth process. Meanwhile, a diffraction grating may be composed of an optical material (e.g., PMMA). The diffraction grating is used as one of the optical devices and the diffraction grating can be applied, for example, to a distributed Bragg reflector laser diode (DBR laser diode). In the DBR laser diode, a diffraction grating is provided in a region different from an active layer region. Furthermore, in the optical nano-imprinting method, the pressing pressure required for pressing the mold to the resin layer can be decreased compared with the thermal nano-imprinting method. Therefore, it is possible to decrease damage to epitaxial layers. Furthermore, in the case where a diffraction grating is formed above an active layer, preferably, a cladding layer is formed on the active layer, a diffraction grating layer is formed thereon, and imprinting is performed thereon. By using such a method, the substantial distance between the surface on which the pressure is applied and the active layer can be increased, and the influence of the pressure on the active layer can be reduced. Thereby, it is possible to decrease the possibility of occurrence of physical damage to an active layer, for example, having a multi-quantum well structure.

In the method of forming a diffraction grating according to this embodiment, as described above, the projections and recesses 12 of the mold 10 are brought into contact with the resin layer 22 in a chamber at a first pressure less than atmospheric pressure, and then the pressure in the chamber is set to a second pressure more than the first pressure by introducing the gas such as air or nitrogen gas into the chamber in such a state. The second pressure may be an atmospheric pressure. Thereby, the portion 22a of the resin layer 22 not facing the projections and recesses 12 is pressed by a differential pressure between the first pressure and the second pressure, and portions of the resin layer 22 are sucked into the recesses 13a and 13b. By such an action, even if the mold 10 is not strongly pressed against the resin layer 22, the recesses 13a and 13b of the mold 10 are fully filled with portions of the resin layer 22. Consequently, by hardening the resin layer 22 while maintaining such a contact between the resin layer 22 and the mold 10, the pattern 24 for the diffraction grating is accurately transferred and molded into the resin layer 22. By using the resin layer 22 having the pattern for the diffraction grating as a mask, the number of defects of the pattern of the diffraction grating formed on the semiconductor member can be decreased. In particular, when the recesses 13a and 13b of the mold 10 are narrow and deep (i.e., have a high aspect ratio), in the conventional method, the recesses of the mold are not easily filled with portions of the resin layer. However, according to this embodiment, even in such a case, the recesses 13a and 13b can be fully filled with portions of the resin layer 22, and therefore, the pattern formed on the mold can be faithfully transferred to the resin layer 22.

Furthermore, as described above, the resin layer 22 is preferably composed of a UV curing resin. The UV curing resin has a low viscosity compared with other resins, such as a thermoplastic resin. Therefore, when the resin layer 22 is composed of the UV curing resin, portions of the resin layer 22 having an airtight space A between themselves and the recesses 13a and 13b of the mold 10 easily move into the recesses 13a and 13b. Consequently, the pattern 24 for the diffraction grating can be more accurately formed on the resin layer 22, and thus the defects of the diffraction grating pattern can be further decreased.

Furthermore, preferably, the viscosity of the resin layer 22 before being hardened is 1.0 mPa·sec or less. By using the resin layer 22 having such a low viscosity, portions of the resin layer 22 become easily to move into the recesses 13a and 13b. Consequently, the pattern 24 for the diffraction grating can be more accurately formed on the resin layer 22, thus further decreasing the defects of the diffraction grating pattern.

Furthermore, when the gas is introduced into the chamber to recover the pressure of the chamber to the atmospheric pressure, the pressure in the environment of the mold 10 and the resin layer 22 is preferably set at the atmospheric pressure, as in this embodiment. In such a case, the portion 22a of the resin 22 body not facing the projections and recesses 12 can be more easily and effectively pressed by the atmospheric pressure, and the recesses 13a and 13b of the mold 10 can be suitably filled with portions of the resin layer 22. Furthermore, after introducing the gas into the chamber, the gas pressure in the chamber may be lower than or higher than the atmospheric pressure. For example, in the case where a thermoplastic resin is used for the resin layer 22, the gas pressure in the chamber is preferably set higher than the atmospheric pressure because the thermoplastic resin has a relatively high viscosity.

Furthermore, as in this embodiment, preferably, the projections and recesses 12 of the mold 10 include a plurality of projections 12a and a projection 12b which surrounds the plurality of projections 12a, the plurality of projections 12a being arranged in rows in a direction intersecting with a predetermined direction which is a longitudinal direction. Thereby, in the projections and recesses 12 for forming the diffraction grating, a pattern in which the recesses 13a and 13b are closed in the plane of the mold 10 can be suitably formed. In this embodiment, the recesses 13a and 13b created by forming the projections 12a and 12b on the mold 10 are used. However, recesses of projections and recesses may be created by forming grooves on the surface of the mold 10. In such a case, the planar shape of the recesses is preferably the same as the planar shape of the recesses 13a and 13b shown in FIG. 1A.

MODIFICATION EXAMPLE

Figure 3:
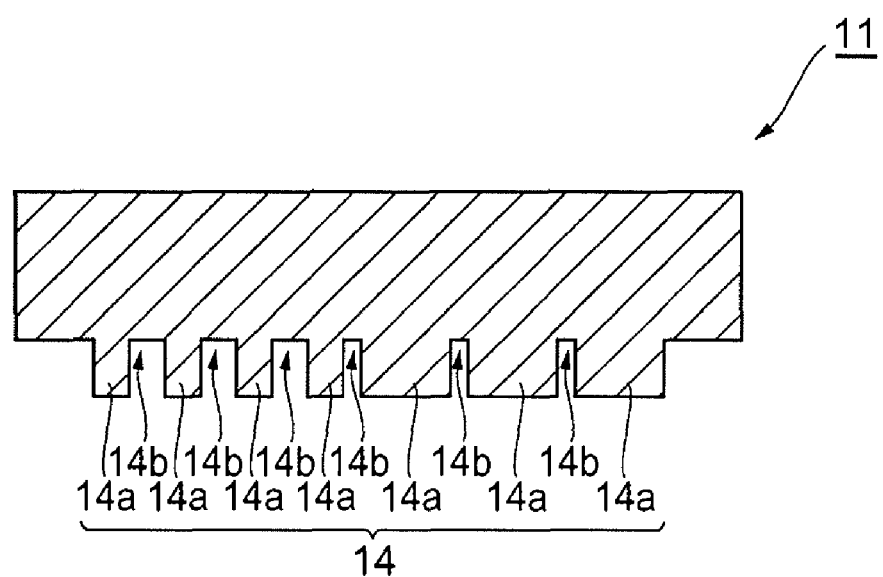
FIG. 3 is a cross-sectional side view showing another example of a mold used in the embodiment.

FIG. 3 is a cross-sectional side view showing another example of a mold used in this embodiment. A mold 11 shown in FIG. 3 has a plate-like shape as in the mold 10 shown in FIG. 1A, and has projections and recesses 14 for forming a diffraction grating. In the projections and recesses 14, the pattern density differs depending on the position in the mold. Specifically, the width of a plurality of projections 14a is large in one region in the mold 11 and small in another region. The width of a plurality of recesses 14b is large in one region and small in another region. That is, the aspect ratio of the recess 14b differs depending on a given region in the mold 11.

In such a case where the pattern density in the projections and recesses 14 differs depending on the position in the mold, it is necessary to completely fill the patterns of the projections and recesses with a resin even if the region in the mold has a low pattern density (where a large amount of a resin is required). In the conventional method, it is necessary to increase the pressure for pressing the mold and to increase the retention time after pressing in order to completely fill the patterns of the projections and recesses with a resin. Thereby, the resin can be easily flowed from a region having a relatively high pattern density to another region having a low pattern density. However, when the resin has a low fluidity, pattern defects occur. In contrast, in the method according to the embodiment described above, portions of the resin layer 22 can be flowed by using the difference in the gas pressure between the inside and the outside of the recesses 14b as a driving force. Therefore, the resin easily flows into the region having a low pattern density even if the resin has a low fluidity. Consequently, the recesses 14b of the projections and recesses 14 are easily filled with the resin without increasing the pressure for pressing the mold, and the occurrence of pattern defects can be suppressed.

<Method of Fabricating Distributed Feedback Laser Diode>

Figure 4A:
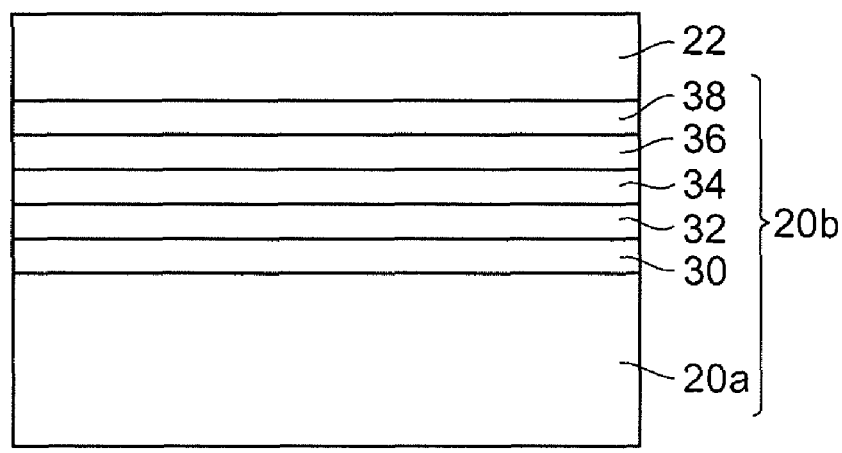
FIGS. 4A and 4B are schematic views showing steps in a method of fabricating a distributed feedback laser diode according to an embodiment of the present invention.
Figure 4B:
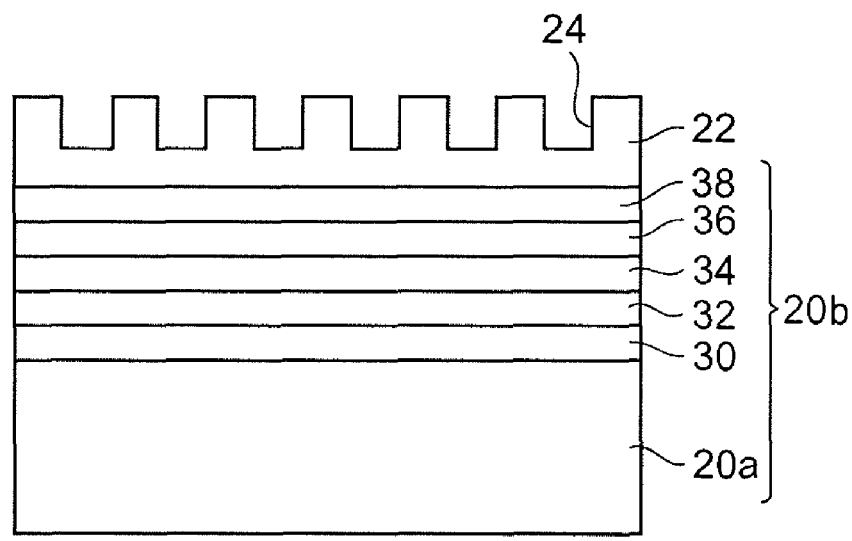
Figure 5:
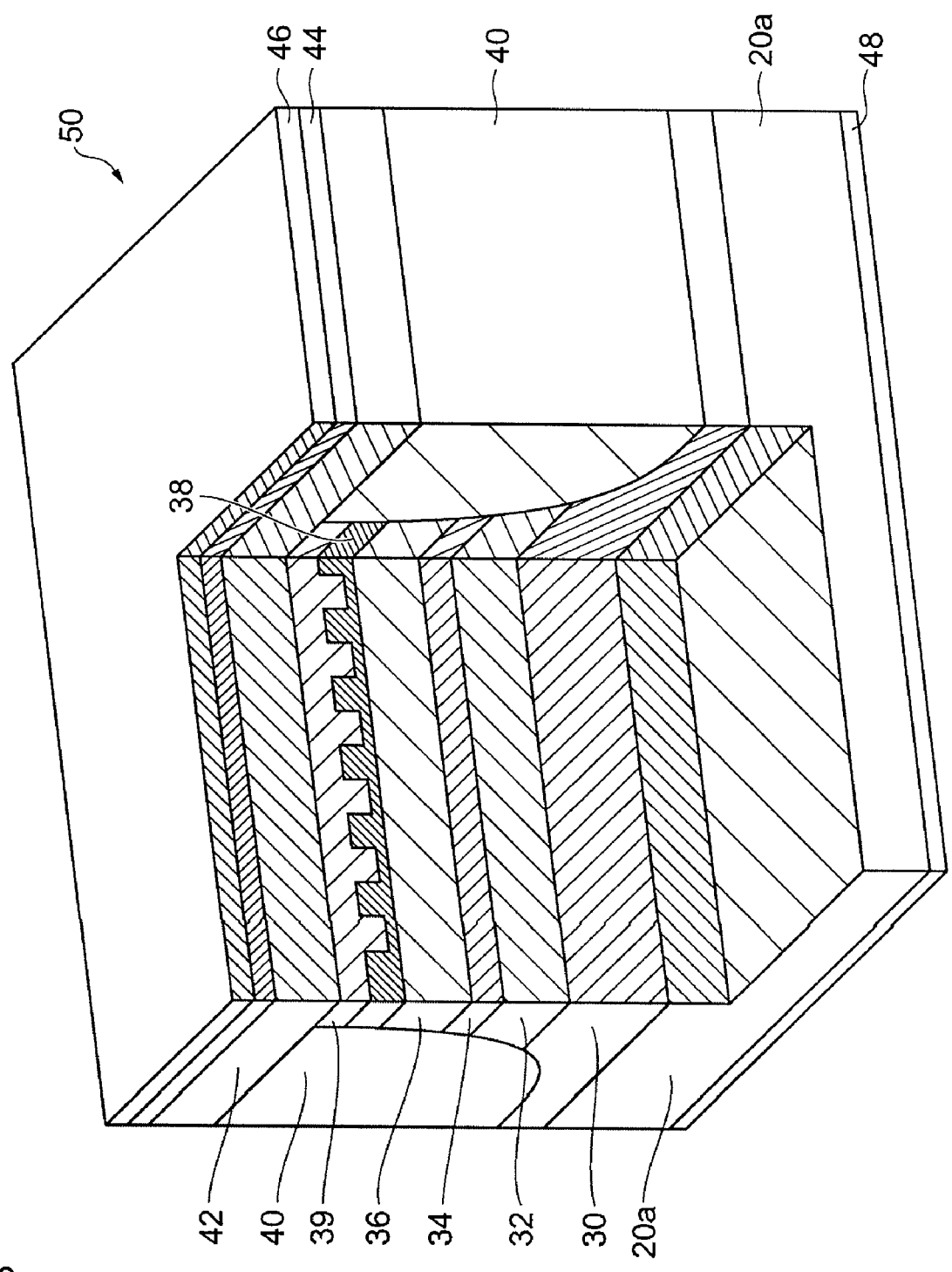
FIG. 5 is a partially cut-out perspective view showing a distributed feedback laser diode fabricated by the fabrication method shown in FIGS. 4A and 4B.

FIGS. 4A and 4B are schematic views showing steps in a method of fabricating a distributed feedback laser diode according to an embodiment of the present invention. FIG. 5 is a partially cut-out perspective view showing a distributed feedback laser diode fabricated by the fabrication method shown in FIGS. 4A and 4B.

(Formation of Resin Layer)

First, as shown in FIG. 4A, a first cladding layer 30, a first optical confinement layer 32, an active layer 34, a second optical confinement layer 36, a diffraction grating layer 38, and a resin layer 22 are formed in that order on a semiconductor substrate 20a. The semiconductor substrate 20a is, for example, composed of a III-V group compound semiconductor, such as n-type InP. The first cladding layer 30 is, for example, composed of a III-V group compound semiconductor, such as n-type InP. The first optical confinement layer 32 is, for example, composed of a III-V group compound semiconductor, such as n-type GaInAsP. The active layer 34, for example, has a multi-quantum well structure composed of GaInAsP. The second optical confinement layer 36 is, for example, composed of a III-V group compound semiconductor, such as p-type GaInAsP. The diffraction grating layer 38 is, for example, composed of a III-V group compound semiconductor, such as p-type GaInAsP. Note that the formation of the first optical confinement layer 32 and the second optical confinement layer 36 may be omitted. The semiconductor substrate 20a, the first cladding layer 30, the first optical confinement layer 32, the active layer 34, the second optical confinement layer 36, and the diffraction grating layer 38 constitute a semiconductor wafer 20b.

Next, as shown in FIG. 4B, using the method of forming a diffraction grating described above, a pattern 24 for a diffraction grating is formed on the hardened resin layer 22. Then, by etching the entire surface of the resin layer 22, portions corresponding to the bottoms of the recesses of the resin layer 22 are completely removed and the semiconductor wafer 20b is partially exposed. Then, by using the remaining resin layer 22 as a mask, the diffraction grating layer 38 is etched. Thereby, a diffraction grating is formed in the diffraction grating layer 38. The resin layer 22 is removed.

Next, as shown in FIG. 5, a second cladding layer 39 is formed on the diffraction grating layer 38 provided with the diffraction grating. The second cladding layer 39 is composed of a different material from the diffraction grating layer 38 and is, for example, composed of a III-V group compound semiconductor, such as p-type InP. Then, a stripe mask is formed on the second cladding layer 39. The stripe mask is, for example, composed of a dielectric film such as SiN or $SiO_2$. Next, the diffraction grating layer 38, the second cladding layer 39, the second optical confinement layer 36, the active layer 34, the first optical confinement layer 32, and the first cladding layer 30 are etched by using a wet etching technique to form a semiconductor mesa. Furthermore, a buried semiconductor layer 40 to cover the side of the semiconductor mesa is formed, and then the stripe mask is removed. Then, a third cladding layer 42 is formed over the buried semiconductor layer 40 and the second cladding layer 39. The buried semiconductor layer 40 is, for example, composed of a semi-insulating III-V group compound semiconductor, such as Fe-doped InP. The buried semiconductor layer 40 may have a stacked structure in which a p-type InP layer and an n-type InP layer are grown in that order. The third cladding layer 42 is, for example, composed of a III-V group compound semiconductor, such as p-type InP. Note that the formation of the third cladding layer 42 may be omitted. Then, a contact layer 44 and an electrode 46 is formed in that order on the third cladding layer 42. The contact layer 44 is, for example, composed of a III-V group compound semiconductor, such as p-type GaInAs. The electrode 46 is, for example, composed of Ti/Pt/Au. Furthermore, an electrode 48 is formed on the back side of the substrate 20. The electrode 48 is, for example, composed of an AuGeNi alloy.

By undergoing the processes described above, it is possible to fabricate a distributed feedback laser diode 50. In the method of fabricating the distributed feedback laser diode according to this embodiment, as in the method of forming the diffraction grating, the pattern 24 for the diffraction grating formed on the mold can be accurately transferred and molded into the resin layer 22. By forming a diffraction grating in the diffraction grating layer 38 using, as a mask, the resin layer 22 to which the pattern 24 for the diffraction grating has been transferred, it is possible to decrease the number of diffraction grating pattern defects.

The method of forming a diffraction grating and the method of fabricating a distributed feedback laser diode according to the present invention are not limited to the embodiments described above, and various modifications are possible. For example, the planar shape of the projections and recesses in the mold in the present invention is not limited to the planar shape shown in FIG. 1A, and various planar shapes can be employed as long as the recesses form a closed pattern in the plane of the mold.

While the principle of the present invention has been illustrated and described above in the preferred embodiments of the invention, it will be appreciated by those skilled in the art that the present invention may be varied in arrangement and detail without departing from the principle. The present invention is not limited to the specific structures disclosed in the embodiments. Therefore, all the modifications and alterations within the scope of the claims or the spirit of the invention are to be construed as being covered by the claims.

What is claimed is:

1. A method of forming a diffraction grating comprising:
a step of preparing a mold having projections and recesses for forming a diffraction grating;
a step of bringing the projections and recesses of the mold into contact with a resin layer in a chamber at a first pressure less than atmospheric pressure;
a step of setting a pressure in the chamber to a second pressure more than the first pressure while maintaining the contact; and
a step of hardening the resin layer while maintaining the contact between the resin layer and the projections and recesses so as to form a pattern for the diffraction grating on the hardened resin layer,
wherein the recesses in the projections and recesses of the mold form a closed pattern in the plane of the mold including the projections and recesses.

2. The method of forming a diffraction grating according to claim 1, wherein the resin layer is composed of an ultraviolet curing resin.

3. The method of forming a diffraction grating according to claim 2, wherein the mold is composed of a material that is transparent to ultraviolet light, and the resin layer is hardened by irradiating the resin layer with ultraviolet light through the mold.

4. The method of forming a diffraction grating according to claim 3, wherein the material of the mold is silica.

5. The method of forming a diffraction grating according to claim 1, wherein the resin layer is composed of a thermoplastic resin or a thermosetting resin.

6. The method of forming a diffraction grating according to claim 1, wherein the viscosity of the resin layer before being hardened is 1.0 mPa· sec or less.

7. The method of forming a diffraction grating according to claim 1, wherein the second pressure in the chamber is an atmospheric pressure.

8. The method of forming a diffraction grating according to claim 1, wherein the projections and recesses of the mold include a plurality of first projections which are arranged in rows in a direction intersecting with a predetermined direction, the predetermined direction being a longitudinal direction, and a second projection which surrounds the plurality of first projections.

9. The method of forming a diffraction grating according to claim 8, wherein the second projection disposed so as to surround the plurality of first projections has a rectangular frame shape having portions extending in the predetermined direction and portions extending in the direction intersecting with the predetermined direction.

10. The method of forming a diffraction grating according to claim 8, wherein a first recess is disposed in a space between two adjacent first projections, and a second recess is disposed between the first projections and the second projection, the second recess and the first recess being integrated to form the closed pattern in the plane of the mold including the projections and recesses.

11. The method of forming a diffraction grating according to claim 1, wherein the aspect ratio of the recess in the projections and recesses of the mold differs depending on a given region in the mold.

12. A method of fabricating a distributed feedback laser diode comprising:
- a step of forming a resin layer on a semiconductor substrate including an active layer;
- a step of preparing a mold having projections and recesses for forming a diffraction grating;
- a step of bringing the projections and recesses of the mold into contact with the resin layer in a chamber at a first pressure less than atmospheric pressure;
- a step of setting a pressure in the chamber to a second pressure more than the first pressure while maintaining the contact;
- a step of hardening the resin layer while maintaining the contact between the resin layer and the projections and recesses so as to form a pattern for the diffraction grating on the hardened resin layer; and
- a step of forming the diffraction grating by etching the semiconductor substrate using the pattern for the diffraction grating, wherein the recesses in the projections and recesses of the mold form a closed pattern in the plane of the mold including the projections and recesses.

* * * * *